US009087916B2

(12) United States Patent
Chang et al.

(10) Patent No.: US 9,087,916 B2
(45) Date of Patent: Jul. 21, 2015

(54) METHOD FOR KEYHOLE REPAIR IN REPLACEMENT METAL GATE INTEGRATION THROUGH THE USE OF A PRINTABLE DIELECTRIC

(71) Applicant: International Business Machines Corporation, Armonk, NY (US)

(72) Inventors: Josephine B. Chang, Mahopac, NY (US); Michael A. Guillorn, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/594,745

(22) Filed: Jan. 12, 2015

(65) Prior Publication Data
US 2015/0126004 A1    May 7, 2015

Related U.S. Application Data

(62) Division of application No. 13/451,054, filed on Apr. 19, 2012, now Pat. No. 8,946,782.

(51) Int. Cl.
| H01L 21/8238 | (2006.01) |
| H01L 21/8234 | (2006.01) |
| H01L 21/84 | (2006.01) |
| H01L 29/66 | (2006.01) |
| H01L 29/16 | (2006.01) |
| H01L 21/027 | (2006.01) |
| H01L 21/02 | (2006.01) |

(52) U.S. Cl.
CPC .... *H01L 21/823431* (2013.01); *H01L 21/0274* (2013.01); *H01L 21/02134* (2013.01); *H01L 21/823437* (2013.01); *H01L 21/845* (2013.01); *H01L 29/16* (2013.01); *H01L 29/66545* (2013.01)

(58) Field of Classification Search
USPC ........... 257/213, 337, 347; 438/233, 197, 301
See application file for complete search history.

(56) References Cited

U.S. PATENT DOCUMENTS

| 5,236,865 | A | 8/1993 | Sandhu et al. |
| 5,783,481 | A | 7/1998 | Brennan et al. |
| 5,855,962 | A | 1/1999 | Cote et al. |
| 6,033,981 | A | 3/2000 | Lee et al. |
| 6,638,805 | B2 | 10/2003 | Park et al. |
| 6,720,255 | B1 | 4/2004 | Faust et al. |
| 6,833,318 | B2 | 12/2004 | Weng et al. |
| 7,084,079 | B2 | 8/2006 | Conti et al. |
| 7,892,912 | B2 | 2/2011 | Kim |
| 7,923,337 | B2 | 4/2011 | Chang et al. |

(Continued)

*Primary Examiner* — Errol Fernandes
(74) *Attorney, Agent, or Firm* — Louis J. Percello; Michael J. Chang, LLC

(57) ABSTRACT

A method of fabricating a FET device is provided that includes the following steps. A wafer is provided. At least one active area is formed in the wafer. A plurality of dummy gates is formed over the active area. Spaces between the dummy gates are filled with a dielectric gap fill material such that one or more keyholes are formed in the dielectric gap fill material between the dummy gates. The dummy gates are removed to reveal a plurality of gate canyons in the dielectric gap fill material. A mask is formed that divides at least one of the gate canyons, blocks off one or more of the keyholes and leaves one or more of the keyholes un-blocked. At least one gate stack material is deposited onto the wafer filling the gate canyons and the un-blocked keyholes. A FET device is also provided.

22 Claims, 14 Drawing Sheets

(56) References Cited

U.S. PATENT DOCUMENTS

| | | |
|---|---|---|
| 8,084,309 B2 | 12/2011 | Cheng et al. |
| 2002/0121699 A1 | 9/2002 | Cheng et al. |
| 2004/0018648 A1 | 1/2004 | Lu et al. |
| 2006/0211237 A1 | 9/2006 | Chen et al. |
| 2007/0082504 A1 | 4/2007 | Dittkrist et al. |
| 2007/0232047 A1 | 10/2007 | Fukasawa et al. |
| 2010/0022061 A1 | 1/2010 | Wu et al. |
| 2011/0045406 A1 | 2/2011 | Keszler et al. |
| 2011/0227162 A1 | 9/2011 | Lin et al. |
| 2013/0026572 A1 | 1/2013 | Kawa et al. | om
METHOD FOR KEYHOLE REPAIR IN REPLACEMENT METAL GATE INTEGRATION THROUGH THE USE OF A PRINTABLE DIELECTRIC

CROSS-REFERENCE TO RELATED APPLICATIONS

This application is a divisional of U.S. application Ser. No. 13/451,054 filed on Apr. 19, 2012, the contents of which are incorporated herein by reference as fully set forth herein.

FIELD OF THE INVENTION

The present invention relates to field-effect transistor (FET) devices, and more particularly, to techniques for fabricating FET devices that implement a modified keyhole repair process that permits use of keyholes, where desired.

BACKGROUND OF THE INVENTION

Replacement metal gate transistor processing relies on the encapsulation of a dummy gate material in a dielectric fill. See, for example, U.S. Pat. No. 7,923,337, issued to Chang et al., entitled "Fin Field Effect Transistor Devices with Self-Aligned Source and Drain Regions," the entire contents of which are incorporated by reference herein.

The dielectric fill serves both a structural and electrical purpose. Specifically, the dielectric fill allows for the selective removal of the dummy gate material. The dielectric fill is also used to insulate between the source/drain (S/D) contact and the gate electrode.

When the dielectric material is deposited around the dummy gates, keyholes, air gaps or voids can be formed in the dielectric in the spaces between the dummy gates. The formation of keyholes during the dielectric deposition process can be a major problem in replacement metal gate processes. Namely, unwanted keyholes can provide a path for the formation of parasitic metal "stringers" which can short out adjacent devices or circuits unintentionally. In some instances, keyhole formation might be desirable. See, for example, U.S. Pat. No. 6,033,981 issued to Lee et al., entitled "Keyhole-free process for high aspect ratio gap filling," which describes how these air gaps or keyholes might be helpful or harmful depending on the situation.

Therefore, fabrication techniques that leverage the helpful aspects of keyhole formation exclusive of the harmful aspects would be desirable.

SUMMARY OF THE INVENTION

The present invention provides techniques for fabricating field-effect transistor (FET) devices that implement a modified keyhole repair process. In one aspect of the invention, a method of fabricating a FET device is provided. The method includes the following steps. A wafer is provided. At least one active area is formed in the wafer. A plurality of dummy gates are formed over the active area, wherein the dummy gates cover portions of the active area that serve as channel regions of the device and wherein portions of the active area that extend out from under the dummy gates serve as source and drain regions of the device. Spaces between the dummy gates are filled with a dielectric gap fill material such that one or more keyholes are formed in the dielectric gap fill material between the dummy gates. The dummy gates are removed to reveal a plurality of gate canyons in the dielectric gap fill material. A mask is formed that divides at least one of the gate canyons, blocks off one or more of the keyholes and leaves one or more of the keyholes un-blocked. At least one gate stack material is deposited onto the wafer filling the gate canyons and the un-blocked keyholes, wherein the gate stack material deposited into the gate canyons serves as replacement gates of the device and the gate stack material deposited into the un-blocked keyholes serves as interconnect structures of the device.

In another aspect of the invention, a FET device is provided. The FET device includes at least one active area formed in the wafer; a plurality of gates over the active area, wherein the gates cover portions of the active area that serve as channel regions of the device and wherein portions of the active area that extend out from under the gates serve as source and drain regions of the device; a dielectric gap fill material in between the gates, wherein one or more keyholes are present in the dielectric gap fill material between the gates; a mask that divides at least one of the gates and blocks off one or more of the keyholes; and one or more interconnect structures of the device formed in one or more of the keyholes.

A more complete understanding of the present invention, as well as further features and advantages of the present invention, will be obtained by reference to the following detailed description and drawings.

DETAILED DESCRIPTION OF PREFERRED EMBODIMENTS

Figure 1A:
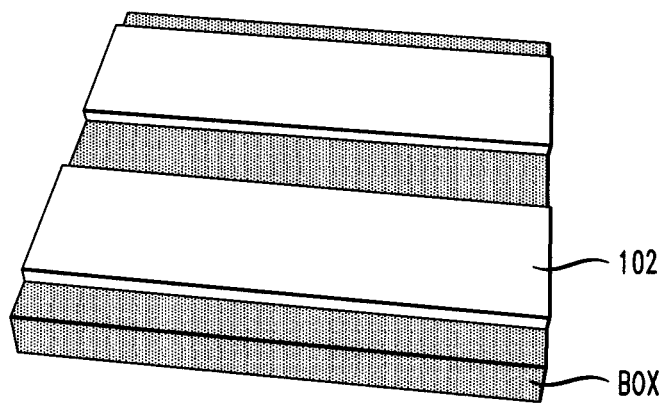
FIG. 1A is a three-dimensional diagram illustrating a plurality of active areas having been formed in a semiconductor-on-insulator (SOI) wafer according to an embodiment of the present invention.
Figure 1B:
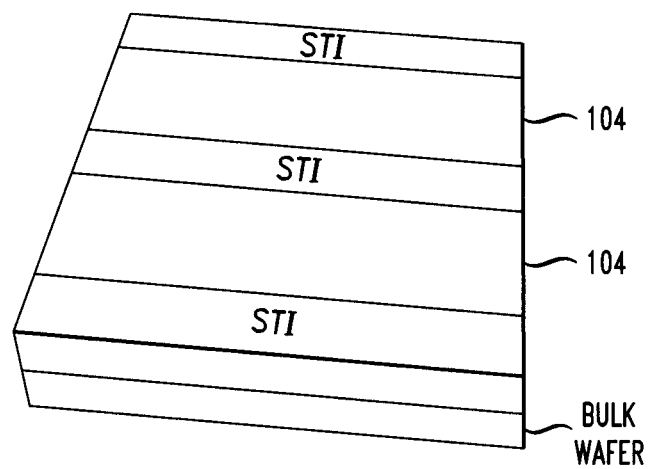
FIG. 1B is a three-dimensional diagram illustrating an alternative starting structure for the process wherein a plurality of active areas have been formed in a bulk semiconductor wafer according to an embodiment of the present invention.

The present teachings address the notion that in certain situations the formation of keyholes during dielectric deposition is advantageous/desirable, while in other situations it is not. The present teachings take advantage of the fact that keyhole formation is highly reproducible and can be controlled through the geometry of the structures present on the wafer at the time of film deposition and the parameters of the film deposition process. Therefore, as presented herein, the benefits of keyhole formation can be selectively exploited (for instance in the formation of interconnect structures used to propagate an electrical signal, see below) exclusive of any undesired effects (formation of parasitic metal "stringers").

The present techniques are generally applicable to any transistor or memory device fabrication process wherein dummy structures (such as dummy gates) are employed, wherein keyholes are intentionally formed during deposition of a dielectric around the dummy structures, and wherein some of the keyholes formed are utilized in the fabrication process, while others are not. Steps are taken to prevent the keyholes not utilized in the process from having a detrimental effect on the device.

The term "dummy structure" as used herein refers to a placeholder structure which will be removed during the fabrication process and replaced with a replacement structure, e.g., a replacement gate in the case of a dummy gate. As will be described in detail below, the replacement structure however does not necessarily have the same dimensions as the dummy structure.

The present techniques are now described by way of reference to FIGS. 1-9 which illustrate an exemplary methodology for fabricating a planar field-effect transistor (FET) device. However, as described above, the present techniques may be generally employed in any transistor or memory device fabrication process wherein dummy structures are employed. Thus, for illustrative purposes only, a specific example implementing the present techniques in the context of a finFET device fabrication process will then be provided and described by way of reference to FIGS. 10-18.

In general a FET device includes a source region and a drain region interconnected by a channel region. A gate over the channel region regulates electron flow through the channel region. The gate is typically separated from the channel region by a dielectric material(s) (i.e., a gate dielectric).

The starting structure for the fabrication process can be a semiconductor-on-insulator (SOI) or a bulk semiconductor wafer. A SOI wafer includes a SOI layer separated from a substrate by a buried oxide or BOX. Suitable semiconductor materials for forming the SOI layer include, but are not limited to, silicon, germanium or silicon germanium. Suitable bulk semiconductor wafers include, but are not limited to, bulk silicon, germanium or silicon germanium wafers. For ease and clarity of depiction, the wafer substrate in the SOI wafer embodiment is not shown in the figures.

A plurality of active areas is then formed in the wafer. The manner in which this is carried out can vary depending on the starting wafer. For instance, when the starting wafer is a SOI wafer, then a standard patterning technique can be used to pattern the SOI layer into active areas 102. See FIG. 1A. By way of example only, the SOI layer can be masked with the footprint and location of the active areas 102, and a dry etching process such as reactive ion etching (RIE) can be used to pattern trenches in the SOI layer down to the BOX. In the exemplary embodiment shown in FIG. 1A, the active areas are "mesa" isolated, as is known in the art. Alternatively, shallow-trench isolation (STI) techniques, also known in the art, may be employed to isolate the active areas (not shown). The STI process is described generally in conjunction with the description of FIG. 1B, below.

Alternatively, when starting with a bulk semiconductor wafer, STI techniques may be employed to form active areas 104 in the wafer. See FIG. 1B. By way of example only, STI involves patterning trenches in the wafer, thereby defining/forming the active areas 104, and then filling the trenches with an insulator (such as an oxide material) to isolate the active areas 104.

A plurality of FET devices will be fabricated on the wafer. Specifically, each of the active areas 102/104 will be used to form multiple FET devices wherein portions of each of the active areas 102/104 covered by a (dummy/replacement) gate (see below) will serve as the channel regions, and portions of the active areas 102/104 extending out from under the gates will serve as source and drain regions.

Figure 2A:
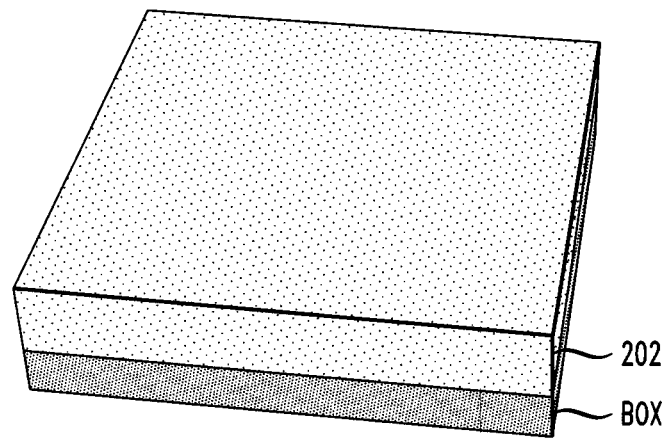
FIG. 2A is a three-dimensional diagram illustrating a dummy gate material having been deposited over the active area of the wafer in the SOI wafer configuration according to an embodiment of the present invention.
Figure 2B:
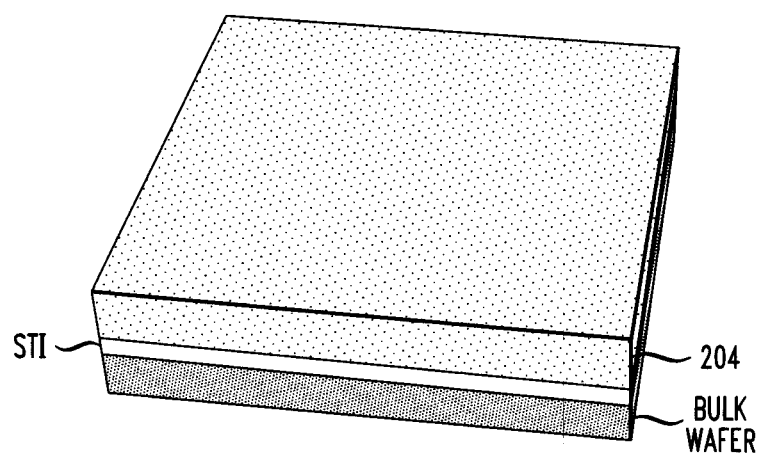
FIG. 2B is a three-dimensional diagram illustrating a dummy gate material having been deposited over the active area of the wafer in the bulk wafer configuration according to an embodiment of the present invention.

Next, a dummy gate material 202/204 is blanket deposited onto the wafer, covering the active areas 102/104. See FIGS. 2A and 2B, respectively. FIG. 2A (which follows from FIG. 1A) depicts the SOI wafer embodiment, whereas FIG. 2B (which follows from FIG. 1B) depicts the bulk wafer embodiment. A requirement of the dummy gate material is that the dummy gate material can be selectively removed from a surrounding dielectric, so as to be replaced with a replacement gate/conductor material (see description below). Suitable dummy gate materials include, but are not limited to, polysilicon, high temperature compatible carbon and silicon nitride. According to an exemplary embodiment, the dummy gate material is deposited using low pressure chemical vapor deposition (LPCVD) to a thickness of from about 100 nanometers (nm) to about 150 nm, e.g., about 40 nm. With regard to carbon materials, most carbon based materials used in patterning break down at relatively low processing temperatures (e.g., many commonly used carbon materials break down at temperatures even below 300° C.) which precludes their use as structural materials when materials with deposition temperatures in excess of 300° C. are deposited on top of them. There are however several commercially available materials that are carbon based and can be taken above 300° C. without catastrophic degradation provided they are processed in an oxygen-free environment. These materials are what are referred to herein as high temperature compatible carbon. Examples of high temperature compatible carbon materials include, but are not limited to, a naphthalene-based spin on material available, e.g., from JSR Corporation, Tokyo, Japan (such as JSR HM8014), chemical vapor deposition (CVD)-deposited carbon materials that may be deposited at temperatures above 400° C. and which do not produce significant outgassing, such as materials from Applied Materials, Santa Clara, Calif. referred to as APF (advanced patterning film) or ACL (amorphous carbon layer), or CVD-deposited carbon films available from Novellus Systems, Inc., San Jose, Calif.

Figure 3A:
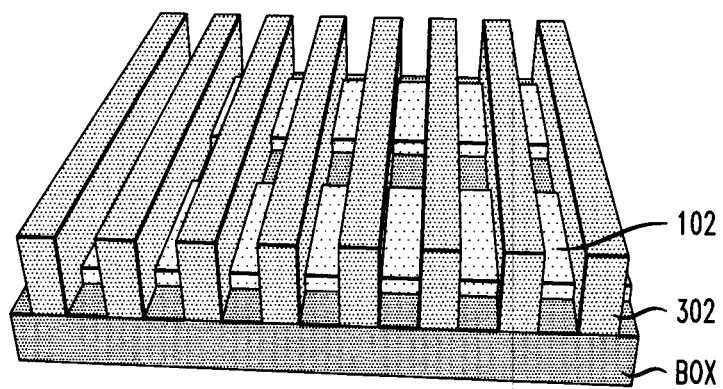
FIG. 3A is a three-dimensional diagram illustrating the dummy gate material having been patterned to form a plurality of dummy gates in the SOI wafer configuration according to an embodiment of the present invention.
Figure 3B:
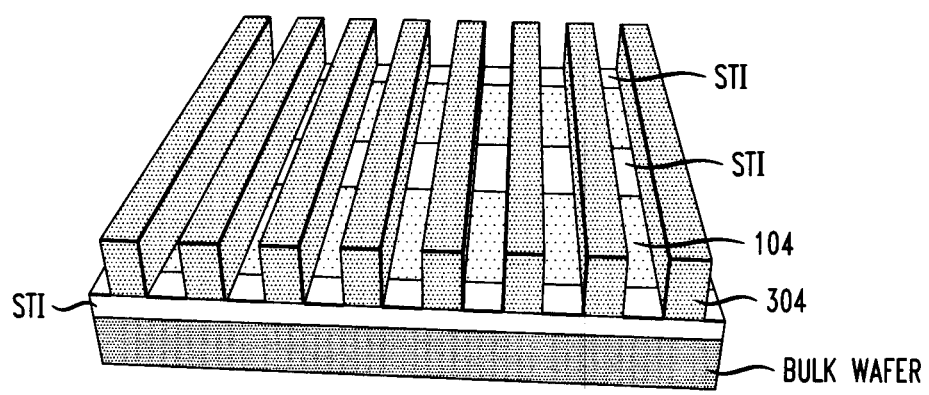
FIG. 3B is a three-dimensional diagram illustrating the dummy gate material having been patterned to form a plurality of dummy gates in the bulk wafer configuration according to an embodiment of the present invention.

The dummy gate material 202/204 is then patterned to form a plurality of dummy gates 302/304. See FIGS. 3A and 3B, respectively. FIG. 3A (which follows from FIG. 2A) depicts the SOI wafer embodiment, whereas FIG. 3B (which follows from FIG. 2B) depicts the bulk wafer embodiment. According to an exemplary embodiment, resist is deposited on dummy gate material 202/204, masked and then patterned with the footprint and location of the dummy gates 302/304. RIE can then used to remove unmasked portions of the dummy gate material, resulting in the formation of dummy gates 302/304. As highlighted above, the portions of each of the active areas 102/104 covered by a gate will serve as the channel regions. These are the portions of the active areas 102/104 that are now covered by the dummy gates 302/304. The portions of the active areas 102/104 extending out from under the gates will serve as source and drain regions. These source and drain regions remain intact after patterning of the dummy gates 302/304.

As will be described in detail below, a dielectric gap fill material will be deposited covering and filling the spaces between the dummy gates in such a manner that keyholes are formed/present in the dielectric gap fill material. Formation of the keyholes in the dielectric gap fill material can depend on how the dielectric gap fill material is deposited. With a non-conformal deposition process, differential deposition rate between the top and bottom of the gap between the dummy gates (also referred to herein as the dummy gate-to-dummy gate gap) will result in keyhole formation. See below. However, if a conformal deposition process is employed to deposit the dielectric gap fill material, then some additional engineering may be needed to make the top of the dummy gate-to-dummy gate gap smaller than the bottom of the dummy gate-to-dummy gate gap. By way of example only, one way to do this is to employ a multilayer dummy gate structure wherein for instance a bottom layer of the dummy gate has a smaller length than a top layer of the dummy gate resulting in a T-shaped dummy gate. See, for example, FIG. 19, described below. To form these T-shaped dummy gates, in this case the first layer of the dummy gate can be formed in the same manner as described above regarding the formation and placement of dummy gates 302/304. A second dummy gate material (suitable dummy gate materials were described above) is then selectively deposited onto the dummy gates 302/304. The second dummy gate material will extend laterally out farther than dummy gates 302/304, thus reducing the top dummy gate-to-dummy gate gap.

At this stage in the process source and drain region doping may be performed. For instance, the formation of source and drain extensions would be performed to make a viable transistor. Using a transistor as an example, the source and drain region extensions can be formed using techniques known to those of skill in the art, such as doping (using, e.g., boron, phosphorous or arsenic) see for example U.S. Pat. No. 7,923, 337 B2 issued to Chang et al., entitled "Fin Field Effect Transistor Devices with Self-Aligned Source and Drain Regions" (hereinafter "Chang"), the contents of which are incorporated by reference herein; use of epitaxial films with in-situ doping see for example U.S. Pat. No. 8,084,309 B2 issued to Cheng et al., entitled "Extremely Thin Silicon on Insulator (ETSOI) Complementary Metal Oxide Semiconductor (CMOS) With in-situ Doped Source and Drain Regions Formed By a Single Mask," the contents of which are incorporated by reference herein; or a combination of these techniques. An anneal may be used to achieve dopant activation and a silicide process may be performed as well. See, for example, U.S. Pat. No. 5,236,865 issued to Sandhu et al., entitled "Method for Simultaneously Forming Silicide and Effecting Dopant Activation on a Semiconductor Wafer," the contents of which are incorporated by reference herein. As is known in the art, offset spacers (for example silicon nitride spacers) are generally formed prior to the source and drain doping. See, for example, Chang. For ease and clarity of description, these offset spacers are not shown in the present figures, however their use and placement would be apparent to one of skill in the art.

Figure 4A:
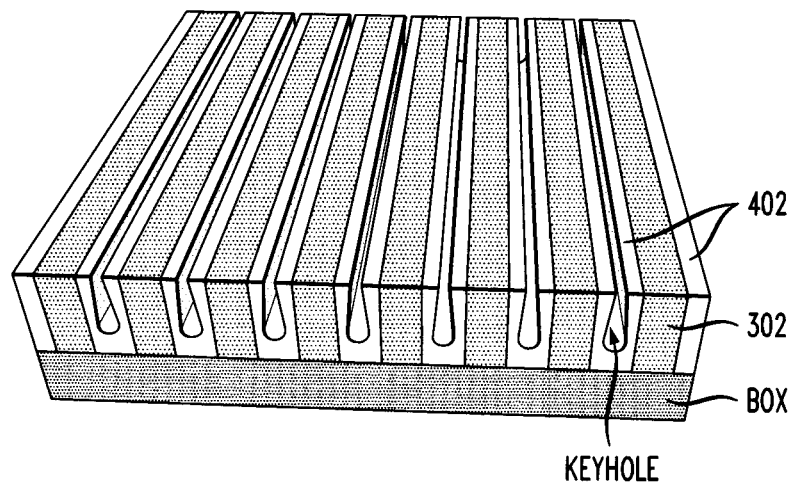
FIG. 4A is a three-dimensional diagram illustrating a dielectric gap fill material having been deposited onto the wafer and filling the spaces between the dummy gates, the dielectric gap fill material having keyholes therein in the SOI wafer configuration according to an embodiment of the present invention.
Figure 4B:
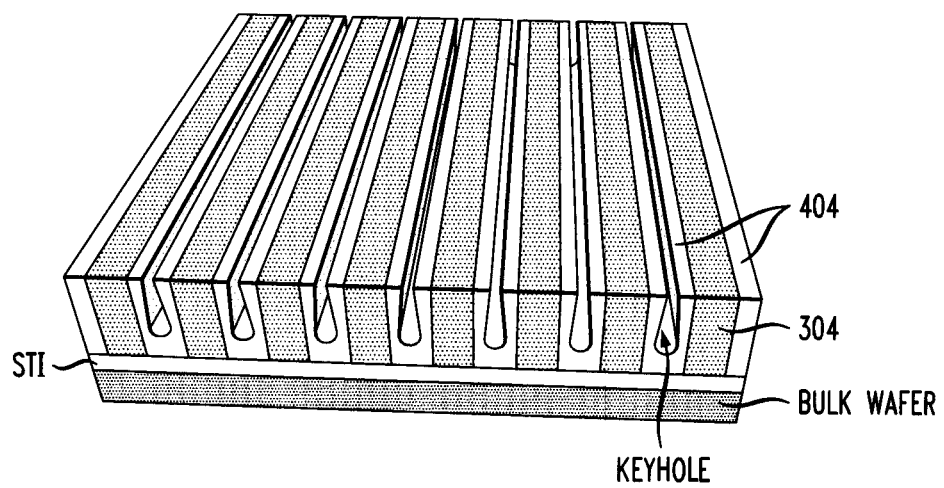
FIG. 4B is a three-dimensional diagram illustrating a dielectric gap fill material having been deposited onto the wafer and filling the spaces between the dummy gates, the dielectric gap fill material having keyholes therein in the bulk wafer configuration according to an embodiment of the present invention.

Next, a dielectric gap fill material 402/404 is deposited onto the wafer, covering the dummy gates 302/304 and filling the spaces between the dummy gates 302/304. See FIGS. 4A and 4B, respectively. FIG. 4A (which follows from FIG. 3A) depicts the SOI wafer embodiment, whereas FIG. 4B (which follows from FIG. 3B) depicts the bulk wafer embodiment. Suitable dielectric gap fill materials include, but are not limited to, silicon oxide (e.g., silicon dioxide), silicon nitride, a low-k dielectric or high-stress films. The dielectric gap fill material 402/404 may be deposited using, for example, chemical vapor deposition (CVD), plasma-enhanced CVD (PECVD), low pressure CVD (LPCVD), evaporation, sputtering and atomic layer deposition (ALD). As shown in FIGS. 4A and 4B, according to the present techniques, the dielectric gap fill material 402/404 is deposited so as to have keyholes present therein. Using the above-described processes for depositing the dielectric gap fill material 402/404, the keyhole can be formed in multiple ways. When using a non-conformal deposition process such as CVD, PECVD, evaporation and sputtering, the deposition rate of the dielectric gap fill material 402/404 at the top of the dummy gate is faster than at the bottom of the dummy gate. This differential deposition rate is considered a standard consequence of all diffusion limited processes. Thus, the result of using a non-conformal deposition process such as CVD, PECVD, evaporation and sputtering results in keyhole formation. Reactant limited processes such as ALD or slow CVD process such as LPCVD can avoid this differential deposition rate issue. Thus, in the case where a reactant limited process such as ALD or LPCVD is used to deposit the dielectric gap fill material 402/404, a keyhole can be induced by tailoring the profile of the dummy gate to have a re-entrant profile. As described above and in conjunction with the description of FIG. 19, below, this can be accomplished by tailoring the dummy gate-to-dummy gate gap to be smaller at the top than at the bottom. This will result in keyhole formation when using a conformal deposition process for the dielectric.

As shown in FIGS. 4A and 4B, once the dielectric gap fill material 402/404 is deposited, portions of the dielectric gap fill material 402/404 (and in some embodiments, portions of the dummy gates 302/304) may be removed using a chemical mechanical polishing (CMP) or etching process that reveals (exposes) portions of the dummy gates 302/304 with the dielectric gap fill material 402/404 disposed therebetween. As shown in FIGS. 4A and 4B, by polishing the dielectric gap fill material, the keyholes present in the dielectric gap fill material between the dummy gates 302/304 are open-ended (i.e., the keyholes form a u-shaped opening or void in the dielectric material). This open-ended configuration permits the keyholes to be filled either with a gate material or a non-conductive material (i.e., so as to block the keyholes). See description below.

Figure 5A:
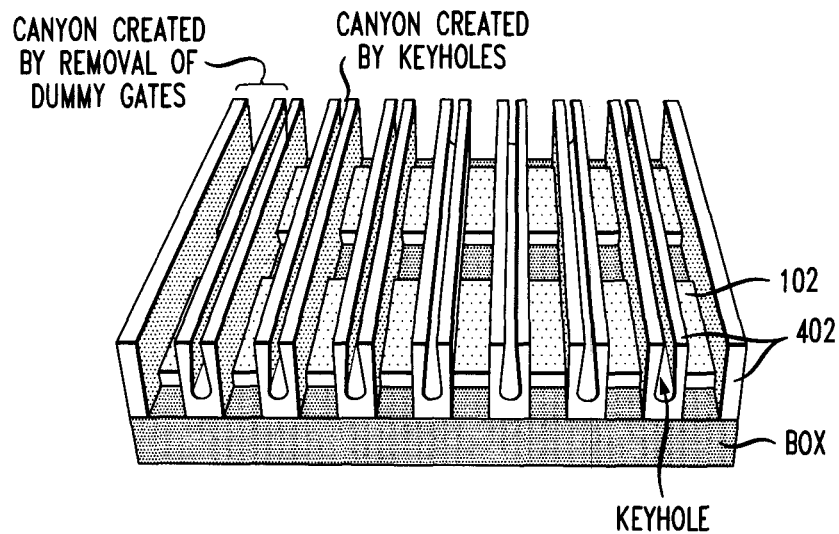
FIG. 5A is a three-dimensional diagram illustrating the dummy gates having been removed forming gate canyons in the SOI wafer configuration according to an embodiment of the present invention.
Figure 5B:
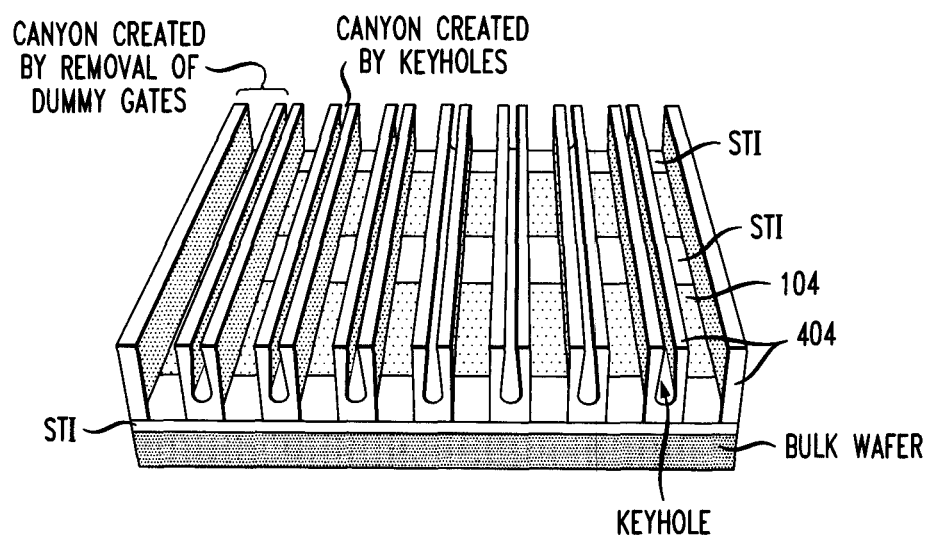
FIG. 5B is a three-dimensional diagram illustrating the dummy gates having been removed forming gate canyons in the bulk wafer configuration according to an embodiment of the present invention.

Next, the dummy gates 302/304 are removed. See FIGS. 5A and 5B, respectively. FIG. 5A (which follows from FIG. 4A) depicts the SOI wafer embodiment, whereas FIG. 5B (which follows from FIG. 4B) depicts the bulk wafer embodiment. The dummy gates 302/304 can be removed using wet chemical etching or dry etching. As shown in FIGS. 5A and 5B, the result is two types of canyons being created in the structure, namely canyons created by removal of the dummy gates 302/304 and canyons created by the keyholes.

As highlighted above, during the present fabrication process keyholes are intentionally created such that some of the keyholes can be used to form interconnect structures in the device. As will be described in detail below, those keyholes that will be used to form interconnect structures will be filled with a gate material. On the other hand, those keyholes not being used to form interconnect structures will be blocked off such that when the gate material is deposited none of the gate material will go into these (blocked off) keyholes.

Further, as highlighted above, according to the present techniques, the replacement gates do not necessarily have the same dimensions (e.g., shape) as the dummy gates. Namely, steps may be performed after the dummy gates are removed to alter the canyons created by removal of the dummy gates such that when the replacement gate material is deposited into the canyons, the dimensions of the resulting replacement gates are altered. For example, according to an exemplary embodiment, dividers are formed in one or more of the dummy gate canyons thus effectively dividing a single dummy gate canyon into multiple replacement gate formation sites. See below.

Figure 6A:
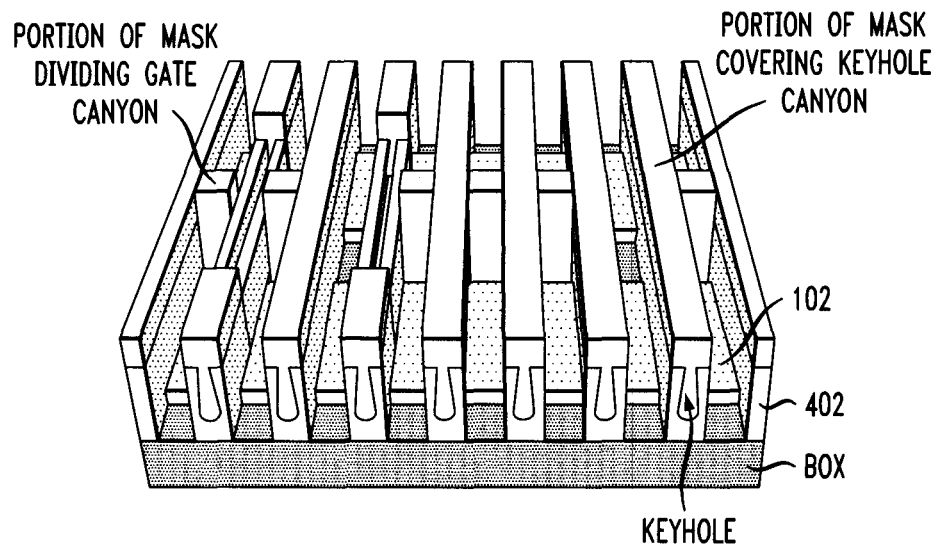
FIG. 6A is a three-dimensional diagram illustrating a mask having been formed that will block sections of the gate canyons and one or more of the keyholes forming discrete regions into which gate material can be deposited and block out regions where gate material will not be deposited in the SOI wafer configuration according to an embodiment of the present invention.
Figure 6B:
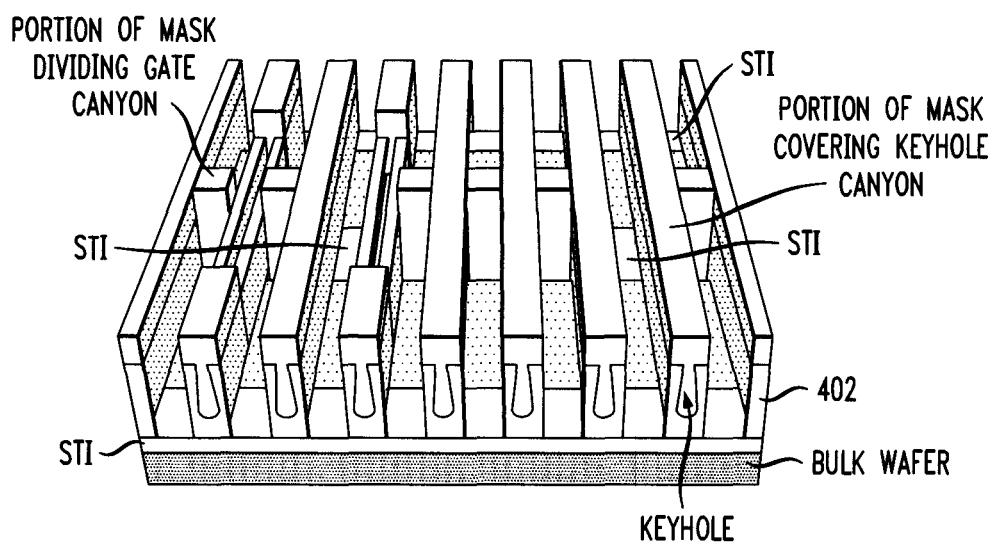
FIG. 6B is a three-dimensional diagram illustrating a mask having been formed that will block sections of the gate canyons and one or more of the keyholes forming discrete regions into which gate material can be deposited and block out regions where gate material will not be deposited in the bulk wafer configuration according to an embodiment of the present invention.

A mask is formed that will block sections of the gate canyons and keyholes forming discrete regions into which gate material can be deposited and block out regions where gate material will not be deposited. See FIGS. 6A and 6B. FIG. 6A (which follows from FIG. 5A) depicts the SOI wafer embodiment, whereas FIG. 6B (which follows from FIG. 5B) depicts the bulk wafer embodiment.

The exact configuration of the mask (i.e., what dummy gate canyons are divided and/or which keyholes are blocked/not blocked) of course depends on the configuration of the device being fabricated. According to an exemplary embodiment, the mask can be patterned from a printable dielectric. The term "printable dielectric" as used herein refers to a class of materials which can be spun-on like a resist, and then cross-linked into a dielectric using a lithographic process such as 193 nm photolithography, extreme UV lithography (EUV) or electron beam (e-beam) lithography. Suitable printable dielectrics include, but are not limited to, printable dielectrics based on silicon dioxide ($SiO_2$) such as DOW Corning XR1541 (a hydrogen silsesquioxane (HSQ resin) or hafnium oxide ($HfO_2$) such as those described in U.S. Patent Application Publication Number 2011/0045406 A1 filed by Keszler et al., entitled "Solution Processed Thin Films and Laminates, Devices Comprising Such Thin Films and Laminates, and Methods for Their Use and Manufacture" (hereinafter "Keszler"), the contents of which are incorporated by reference herein.

By way of example only, the mask can be formed by depositing, e.g., spinning-on, a printable dielectric material such as those described above onto the wafer. A spin-on process will ensure that the deposited dielectric material will completely fill the gate and keyhole canyons. In the areas where the mask is desired (i.e., so as to block off certain keyholes and/or to divide certain gate canyons), the printable dielectric is cross-linked through a lithographic process such as 193 nm photolithography, extreme ultraviolet (EUV) or e-beam lithography. Any printable dielectric material which is not cross-linked is then removed with a developer which removes uncross-linked material selectively to cross-linked material. An example of a developer suitable for HSQ is dilute Tetramethylammonium hydroxide (TMAH).

Alternatively, the mask can be formed from a high temperature compatible carbon material (see above for description of suitable high temperature compatible carbon materials, such as naphthalene-based polymers, or CVD carbon films that can be deposited at temperatures above 400° C. such as APF and ACL). In this case, the mask can be formed by depositing, e.g., spinning-on, the high temperature compatible carbon material onto the wafer. A spin-on process will ensure that the deposited high temperature compatible carbon material will completely fill the gate and keyhole canyons. The high temperature compatible carbon material is then patterned using, for example, a RIE process, to form the mask. As above, the mask formed in this manner will be used to block off certain keyholes and/or to divide certain gate canyons. The RIE chemistry used in this mask forming step should be configured to etch the high temperature compatible carbon material selective to the active areas 102/104 and the dielectric gap fill material 402/404. Examples include, but are not limited to, RIE chemistries based on $O_2$, $CO_2$, $N_2$, $H_2$, $NH_3$, Ar, or any combination of thereof.

Figure 7A:
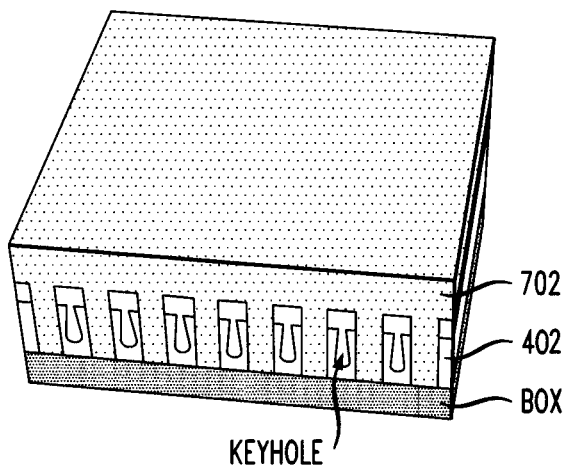
FIG. 7A is a three-dimensional diagram illustrating a gate stack material having been deposited onto the wafer filling the gate canyons and keyholes not blocked by the mask in the SOI wafer configuration according to an embodiment of the present invention.
Figure 7B:
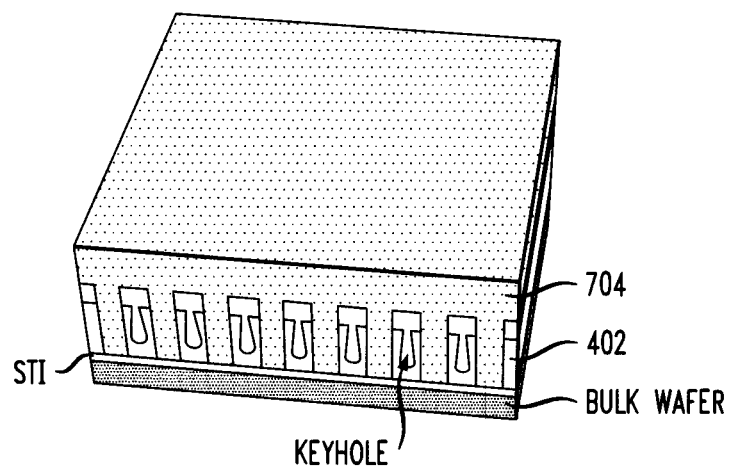
FIG. 7B is a three-dimensional diagram illustrating a gate stack material having been deposited onto the wafer filling the gate canyons and keyholes not blocked by the mask in the bulk wafer configuration according to an embodiment of the present invention.

A gate stack material 702/704 is then deposited onto the wafer. See FIGS. 7A and 7B, respectively. FIG. 7A (which follows from FIG. 6A) depicts the SOI wafer embodiment, whereas FIG. 7B (which follows from FIG. 6B) depicts the bulk wafer embodiment. As shown in FIGS. 7A and 7B, the gate stack material will fill those portions of the gate canyons and those keyholes not blocked off by the mask. The gate stack material 702/704 may include any suitable gate stack material, and is not limited to a single type or layer of material. By way of example only, the gate stack material 702/704 may include materials that can form a dielectric portion and a gate electrode portion of a complementary metal oxide semiconductor field effect transistor (CMOS FET) device or a metal oxide semiconductor field effect transistor (MOSFET) device or any other type of FET device.

Examples of materials that may be used to form the dielectric portion may include $SiO_2$, $SiO_xN_y$, or high-k materials such as $HfO_2$, $HfO_xN_y$, $HfSiO_xN_y$, $Al_2O_3$, and ZrO, while examples of the materials that may be used to for the gate electrode portion of the gate stack material 702/704 may include TiN, TaN, TaAlN, Al, Ti, AlO and Si. The gate stack materials 702/704 may be formed in any suitable order using any suitable deposition process such as, for example, chemical vapor deposition (CVD), plasma enhanced CVD (PECVD), spin-on or atomic layer deposition (ALD) processes.

Figure 8A:
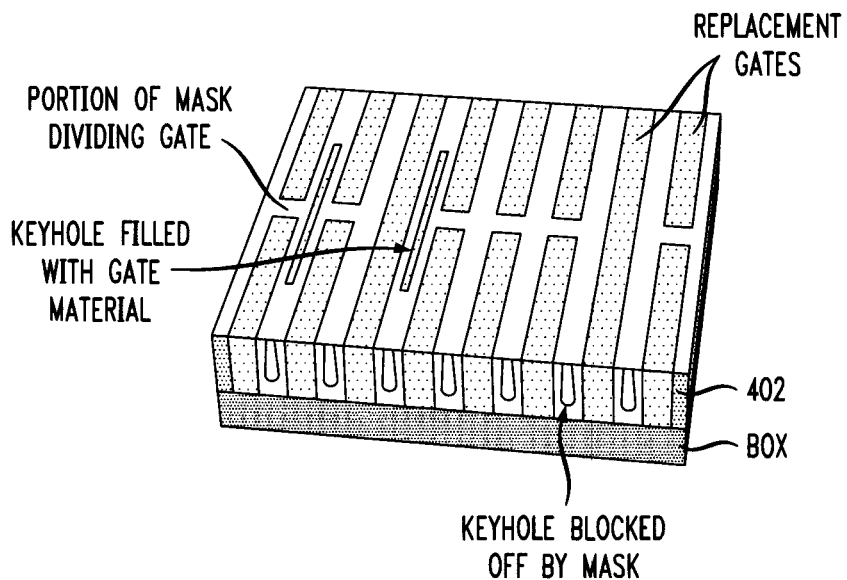
FIG. 8A is a three-dimensional diagram illustrating portions of the gate stack material having been removed to reveal the dielectric gap fill material in the SOI wafer configuration according to an embodiment of the present invention.
Figure 8B:
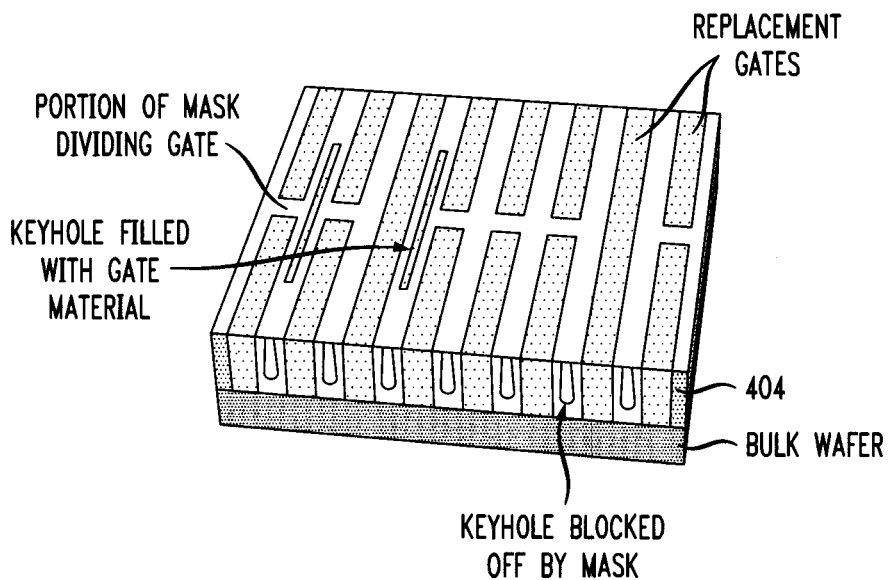
FIG. 8B is a three-dimensional diagram illustrating portions of the gate stack material having been removed to reveal the dielectric gap fill material in the bulk wafer configuration according to an embodiment of the present invention.

Next, a portion of the gate stack material 702/704 (and in some cases portions of the dielectric gap fill material 402/404 and portions of the mask) is removed, e.g., using CMP or etch back, until discrete patterns are formed by revealing (exposing) the encapsulated dielectric gap fill material 402/404. See FIGS. 8A and 8B respectively. FIG. 8A (which follows from FIG. 7A) depicts the SOI wafer embodiment, whereas FIG. 8B (which follows from FIG. 7B) depicts the bulk wafer embodiment. As shown in FIGS. 8A and 8B, this step will reveal distinct replacement gates formed by the gate stack material 702/704 in the spaces left by removal of the dummy gates. As described above, the gates cover a portion of each of the active areas that serve as channel regions of the device, and the portions of the active areas extending out from under the gates serve as source and drain regions of the device. Further, as shown in FIGS. 8A and 8B, one or more of the replacement gates are divided by the mask and one or more of the keyholes are blocked off by the mask. Other open keyholes are now filled with gate stack material 702/704. These filled keyholes will serve as interconnects of the device.

Figure 9A:
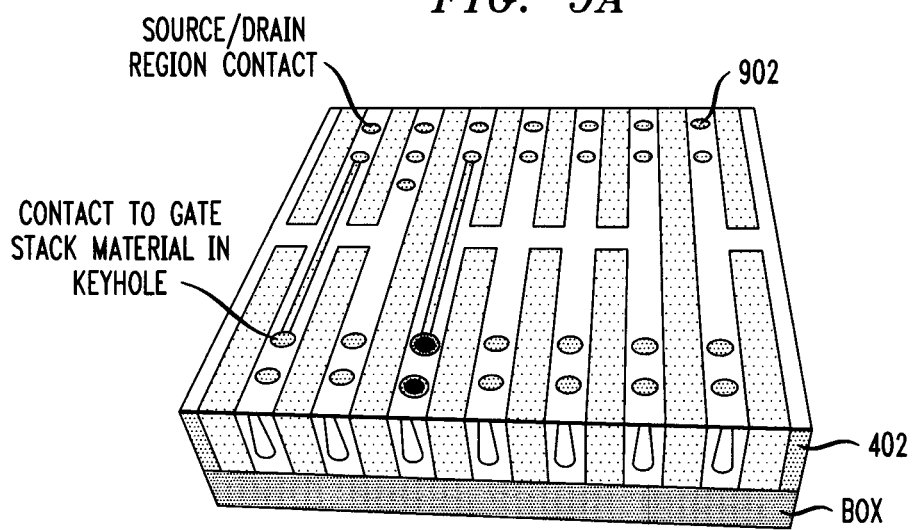
FIG. 9A is a three-dimensional diagram illustrating contacts having been patterned into the remaining dielectric gap fill material in the SOI wafer configuration according to an embodiment of the present invention.
Figure 9B:
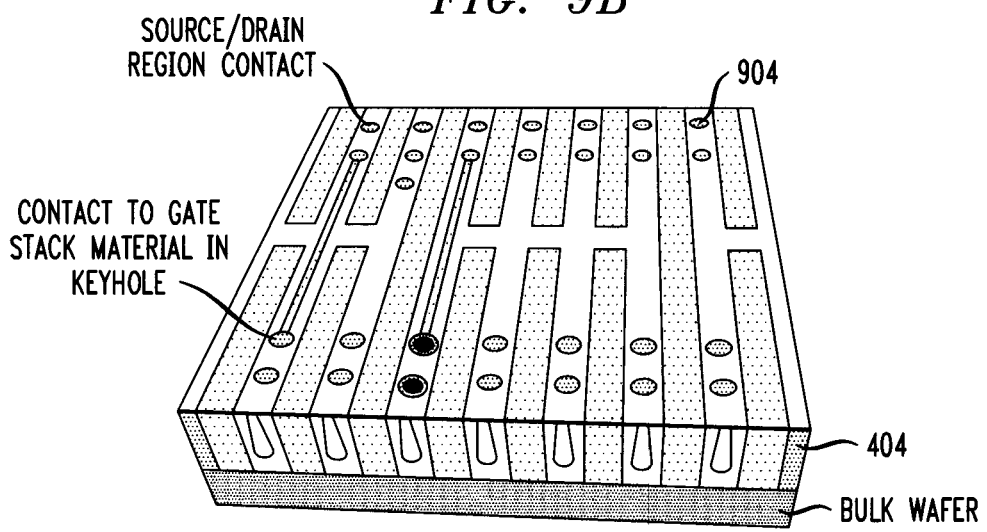
FIG. 9B is a three-dimensional diagram illustrating contacts having been patterned into the remaining dielectric gap fill material in the bulk wafer configuration according to an embodiment of the present invention.
Figure 10:
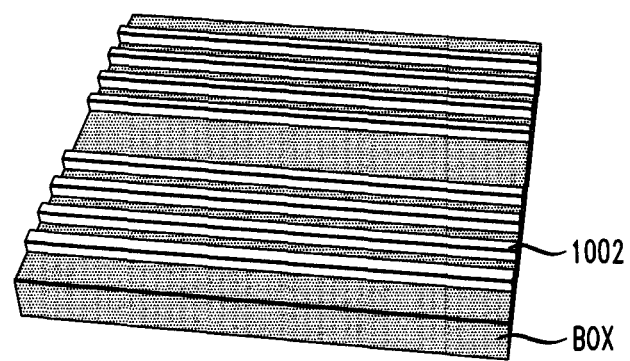
FIG. 10 is a three-dimensional diagram illustrating a plurality of fins having been patterned in a SOI layer of a SOI wafer according to an embodiment of the present invention.

Contacts 902/904 can then be patterned into the remaining dielectric gap fill material 402/404 that either connect with the source and drain regions (i.e., portions of the fins extending out from under the gates) or with the gate stack material 702/704 entrained in the keyholes (i.e., the interconnect structures). See FIGS. 9A and 9B, respectively. FIG. 9A (which follows from FIG. 8A) depicts the SOI wafer embodiment, whereas FIG. 9B (which follows from FIG. 8B) depicts the bulk wafer embodiment. In the latter case (the case where the contacts connect with the gate stack material in the keyholes), a self-aligned interconnect is formed that is insulated from the adjacent gate material and the underlying source and drain regions. Any via that penetrates the keyhole will be self-aligned to the keyhole region. Contacts can be formed from any suitable metallurgy for making contacts to semiconductor devices including titanium (Ti), titanium nitride (TiN), tantalum (Ta), tantalum nitride (TaN), tungsten (W), copper (Cu), aluminum (Al), silicon (Si) and combinations including at least one of the foregoing materials, such as TiN/Ti/W and TaN/Ta/Cu, Al, TiSix, TaSix, WSix. The procedures for fabricating the contacts would be well within the capabilities of one of skill in the art and thus are not described further herein.

As highlighted above, the present techniques are generally applicable to any transistor or memory device fabrication process wherein dummy structures (such as dummy gates) are employed. A specific exemplary implementation of the present techniques to fabricate finFET devices will now be presented by way of reference to FIGS. 10-19. In general, a finFET device includes a source region and a drain region connected by a channel region made up of one or more fin-shaped channels. There is a gate over the fins that regulates electron flow through the channel. The gate is typically separated from the fin channel by a dielectric material(s).

In this example, the starting structure for the fabrication process is a SOI wafer. As described above, a SOI wafer includes a SOI layer (e.g., a silicon, germanium or silicon germanium layer) separated from a substrate by a BOX. It is notable however that finFET devices can be fabricated in a bulk semiconductor wafer using, e.g., STI and junction isolation. See, for example, U.S. Patent Application Publication Number 2011/0227162 A1 filed by Lin et al., entitled "Method of Making a FINFET, and FINFET Formed by the Method," and Fried et al., Comparison Study of FinFETs: SOI vs. Bulk, Performance, Manufacturing Variability and Cost," SOI Industry Consortium (2009), the contents of each of which are incorporated by reference herein.

Standard patterning techniques may then be used to pattern a plurality of fins 1002 in the SOI layer. The fins are formed in what was generally described above as an active area(s) of the device wafer. See FIG. 10. For ease and clarity of depiction, the wafer substrate is not shown in FIGS. 10-19.

In this example, a plurality of finFET devices will be fabricated on the wafer. Specifically, each of the fins 1002 will be used to form multiple FET devices wherein portions of each of the fins covered by a (dummy/replacement) gate (see below) will serve as the channel regions, and wherein portions of the fins extending out from under the gates will serve as source and drain regions.

Figure 11:
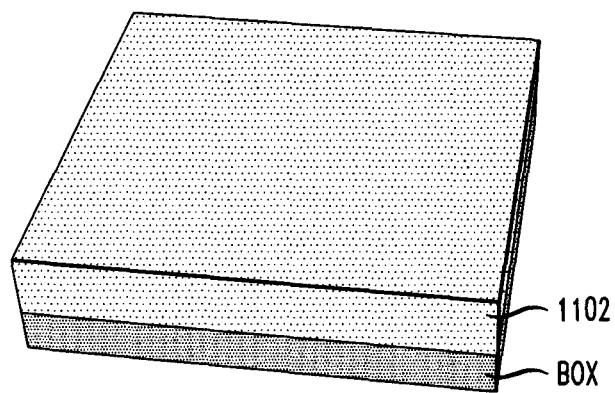
FIG. 11 is a three-dimensional diagram illustrating a dummy gate material having been deposited over the active area of the wafer, covering the fins according to an embodiment of the present invention.
Figure 12:
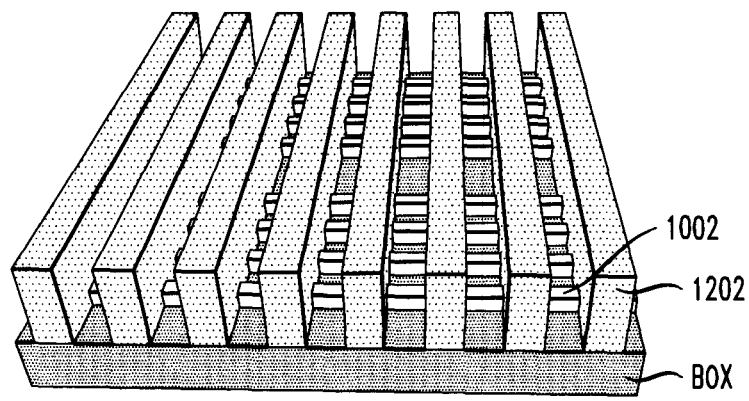
FIG. 12 is a three-dimensional diagram illustrating the dummy gate material having been patterned to form a plurality of dummy gates according to an embodiment of the present invention.

Next, as shown in FIG. 11, a dummy gate material 1102 is blanket deposited onto the active area of the wafer, covering the fins 1002. A requirement of the dummy gate material is that the dummy gate material can be selectively removed from the surrounding dielectric, so as to be replaced with a replacement gate/conductor material (see below). As provided above, suitable dummy gate materials include, but are not limited to, polysilicon, high temperature compatible carbon (see above for description of suitable high temperature compatible carbon materials, such as naphthalene-based polymers, or CVD carbon films that can be deposited at temperatures above 400° C. such as APF and ACL) and silicon nitride. According to an exemplary embodiment, the dummy gate material is deposited using LPCVD to a thickness of from about 100 nm to about 150 nm, e.g., about 140 nm.

The dummy gate material 1102 is then patterned to form a plurality of dummy gates 1202. See FIG. 12. According to an exemplary embodiment, resist is deposited on dummy gate material 1102, masked and then patterned with the footprint and location of the dummy gates 1202. RIE can then used to remove unmasked patterns of the dummy gate material, resulting in the formation of dummy gates 1202 over the fins 1002. As highlighted above, the portions of each of the fins 1002 covered by a gate will serve as the channel regions. These are the portions of the fins 1002 that are now covered by the dummy gates 1202. See FIG. 12. The portions of the fins extending out from under the gates will serve as source and drain regions.

Next, a dielectric gap fill material 1302 is deposited onto the wafer, covering the dummy gates 1202 and filling the spaces between the dummy gates 1202. See FIG. 13. As provided above, suitable dielectric gap fill materials include, but are not limited to, silicon oxide (e.g., silicon dioxide), silicon nitride, a low-k dielectric or high-stress films. Techniques for depositing/forming the dielectric gap fill material so as to result in keyhole formation were described above.

Figure 13:
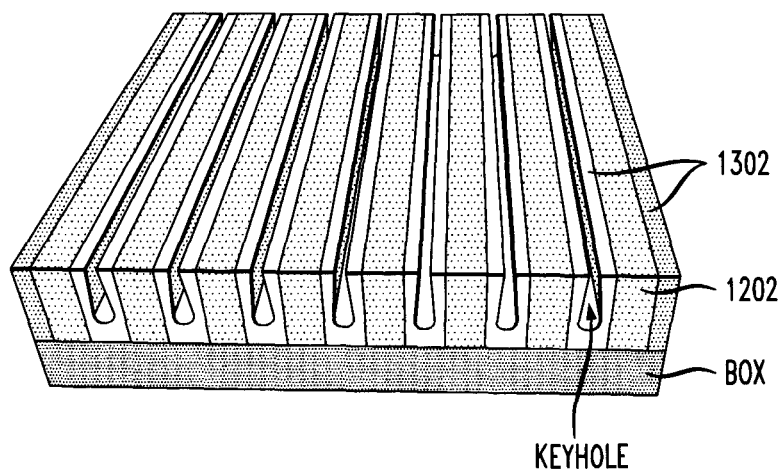
FIG. 13 is a three-dimensional diagram illustrating a dielectric gap fill material having been deposited onto the wafer and filling the spaces between the dummy gates, the dielectric gap fill material having keyholes therein according to an embodiment of the present invention.

As shown in FIG. 13, once the dielectric gap fill material 1302 is deposited, portions of the dielectric gap fill material 1302 (and in some embodiments, portions of the dummy gates 1202) may be removed using CMP or other etching process that reveals (exposes) portions of the dummy gates 1202 with the dielectric gap fill material 1302 disposed therebetween. As shown in FIG. 13, by polishing the dielectric gap fill material, the keyholes present in the dielectric gap fill material between the dummy gates 1202 are open-ended (i.e., the keyholes form a u-shaped opening or void in the dielectric material). This open-ended configuration permits the keyholes to be filled either with a gate material or a non-conductive material (i.e., so as to block the keyholes). See description below.

Figure 14:
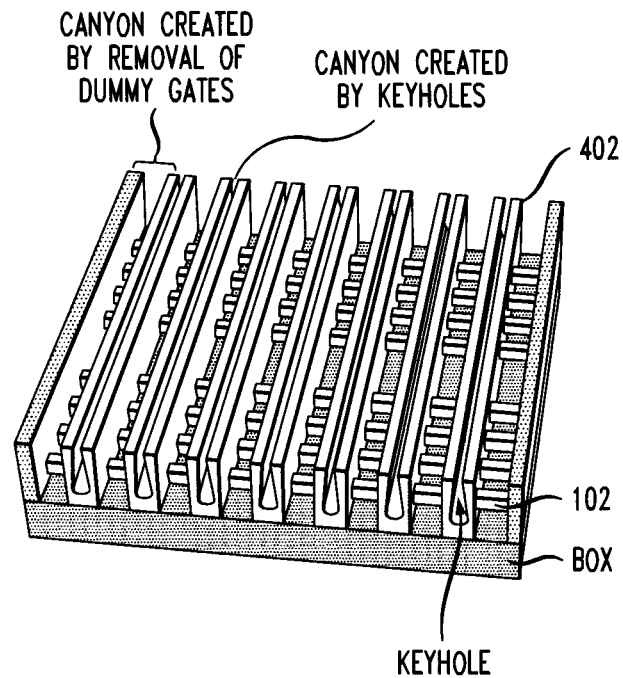
FIG. 14 is a three-dimensional diagram illustrating the dummy gates having been removed forming gate canyons according to an embodiment of the present invention.

Next, the dummy gates 1202 are removed. See FIG. 14. The dummy gates 1202 can be removed using wet chemical etching or dry etching. As shown in FIG. 14, the result is two types of canyons being created in the structure, namely canyons created by removal of the dummy gates 1202 and canyons created by the keyholes.

As highlighted above, during the process keyholes are intentionally created such that some of the keyholes can be used to form interconnect structures in the device. As will be described in detail below, those keyholes that will be used to form interconnect structures will be filled with a gate material. Those keyholes not being used to form interconnect structures will be blocked off such that when the gate material is deposited none of the gate material will go into these (blocked off) keyholes.

Further, as highlighted above, according to the present techniques, the replacement gates do not necessarily have the same dimensions (e.g., shape) as the dummy gates. Namely, steps may be performed after the dummy gates are removed to alter the canyons created by removal of the dummy gates such that when the replacement gate material is deposited into the canyons, the dimensions of the resulting replacement gates are altered. For example, according to an exemplary embodiment, dividers are formed in one or more of the dummy gate canyons thus effectively dividing a single dummy gate canyon into multiple replacement gate formation sites. See below.

Figure 15:
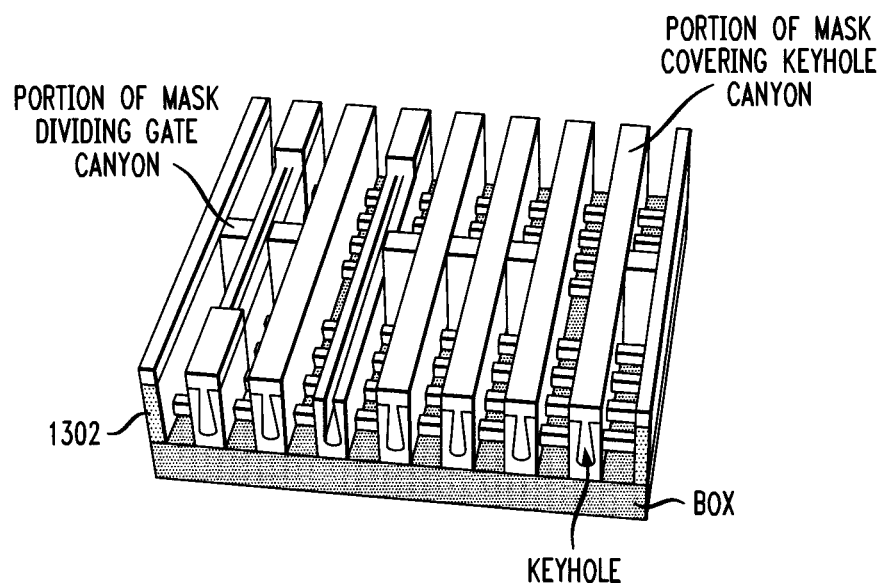
FIG. 15 is a three-dimensional diagram illustrating a mask having been formed that will block sections of the gate canyons and one or more of the keyholes forming discrete regions into which gate material can be deposited and block out regions where gate material will not be deposited according to an embodiment of the present invention.

As shown in FIG. 15, a mask is formed that will block sections of the gate canyons and keyholes forming discrete regions into which gate material can be deposited and block out regions where the gate material will not be deposited. The exact configuration of the mask (i.e., what dummy gate canyons are divided and/or which keyholes are blocked/not blocked) of course depends on the configuration of the device being fabricated. According to an exemplary embodiment, the mask can be patterned from a printable dielectric. As described above, as used herein the term "printable dielectric" refers to a class of materials which can be spun-on like a resist, and then cross-linked into a dielectric using a lithographic process such as 193 nm photolithography, EUV or e-beam lithography. Suitable printable dielectrics include, but are not limited to, printable dielectrics based on $SiO_2$ such as DOW Corning XR1541 (a hydrogen silsesquioxane (HSQ resin) or $HfO_2$ such as those described in Keszler.

By way of example only, the mask can be formed by depositing, e.g., spinning-on, a printable dielectric material such as those described above onto the wafer. A spin-on process will ensure that the deposited dielectric material will completely fill the gate and keyhole canyons. In the areas where the mask is desired (i.e., so as to block off certain keyholes and/or to divide certain gate canyons), the printable dielectric is cross-linked through a lithographic process such as 193 nm photolithography, EUV or e-beam lithography. Any printable dielectric material which is not cross-linked is then removed with a developer (e.g., TMAH) which removes uncross-linked material selectively to cross-linked material.

Alternatively, the mask can be formed from a high temperature compatible carbon material (see above for description of suitable high temperature compatible carbon materials, such as naphthalene-based polymers, or CVD carbon films that can be deposited at temperatures above 400° C. such as APF and ACL). In this case, the mask can be formed by depositing, e.g., spinning-on, the high temperature compatible carbon material onto the wafer. A spin-on process will ensure that the deposited high temperature compatible carbon material will completely fill the gate and keyhole canyons. The high temperature compatible carbon material may then be patterned using, for example, a RIE process, to form the mask. As above, the mask formed in this manner will be used to block off certain keyholes and/or to divide certain gate canyons. The RIE chemistry used in this mask-forming step should be configured to etch the high temperature compatible carbon material selective to the fins 1002 and the dielectric gap fill material 402. As provided above, examples include, but are not limited to, RIE chemistries based on $O_2$, $CO_2$, $N_2$, $H_2$, $NH_3$, Ar, or any combination of thereof.

Figure 16:
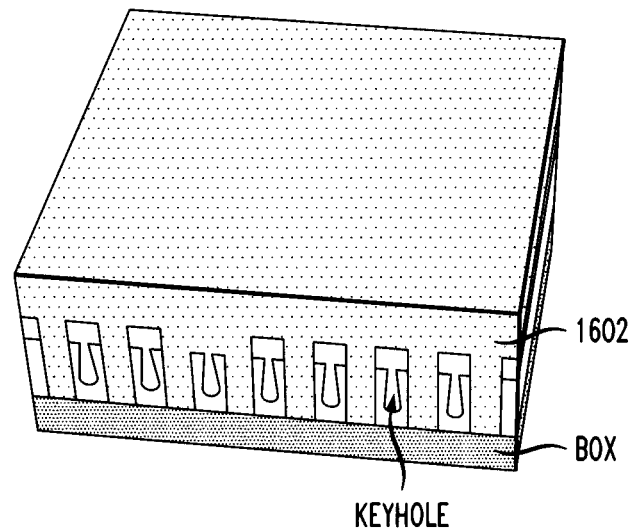
FIG. 16 is a three-dimensional diagram illustrating a gate stack material having been deposited onto the wafer filling the gate canyons and keyholes not blocked by the mask according to an embodiment of the present invention.

A gate stack material 1602 is then deposited onto the wafer. See FIG. 16. As shown in FIG. 16, the gate stack material will fill those portions of the gate canyons and those keyholes not blocked off by the mask. The gate stack material 1602 may include any suitable gate stack material, and is not limited to a single type or layer of material. By way of example only, the gate stack material 1602 may include materials that can form a dielectric portion and a gate electrode portion of a CMOS FET device or a MOSFET device or any other type of FET device.

Examples of materials that may be used to form the dielectric portion may include $SiO_2$, $SiO_xN_y$, or high-k materials such as $HfO_2$, $HfO_xN_y$, $HfSiO_xN_y$, $Al_2O_3$, and ZrO, while examples of the materials that may be used to form the gate electrode portion of the gate stack material 1602 may include TiN, TaN, TaAlN, Al, Ti, AlO and Si. The gate stack material 1602 may be formed in any suitable order using any suitable deposition process such as, for example, CVD, PECVD, spin-on or ALD processes.

Figure 17:
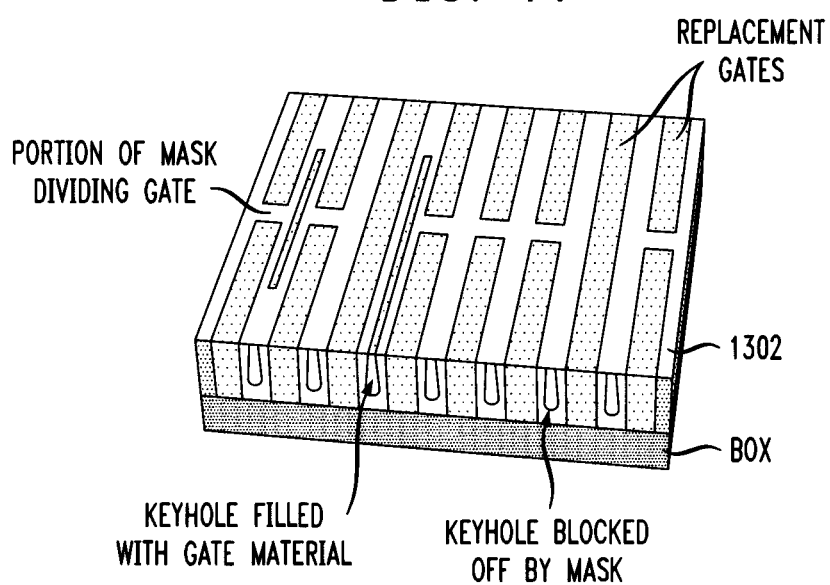
FIG. 17 is a three-dimensional diagram illustrating portions of the gate stack material having been removed to reveal the dielectric gap fill material according to an embodiment of the present invention.
Figure 18:
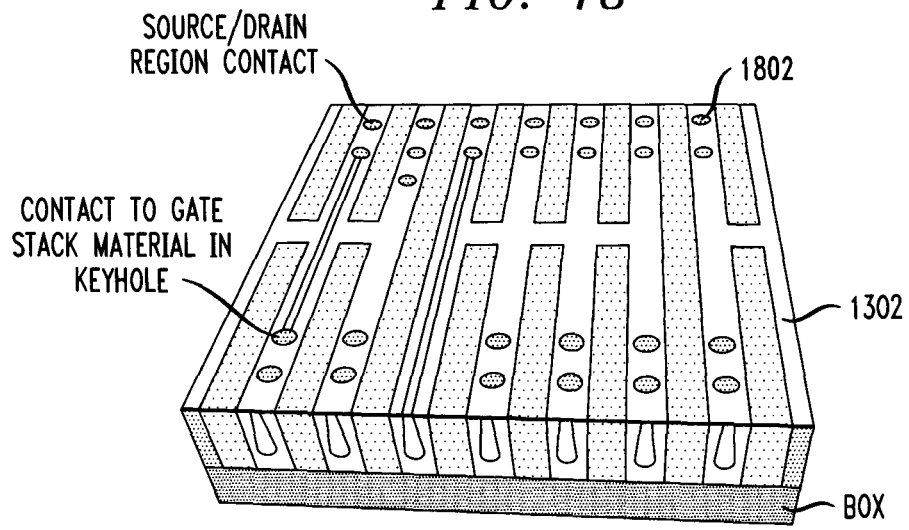
FIG. 18 is a three-dimensional diagram illustrating contacts having been patterned into the remaining dielectric gap fill material according to an embodiment of the present invention.

Next, a portion of the gate stack material 1602 (and in some cases portions of the dielectric gap fill material 1302 and portions of the mask) is removed, e.g., using CMP or etch back, until discrete patterns are formed by revealing (exposing) the encapsulated dielectric gap fill material 1302. See FIG. 17. As shown in FIG. 17, this step will reveal distinct replacement gates formed by the gate stack material 1602 in the spaces left by removal of the dummy gates. As described above, the gates cover a portion of each of the fins that serve as channel regions of the device, and the portions of the fins extending out from under the gates serve as source and drain regions of the device. Further, as shown in FIG. 17, one or more of the replacement gates are divided by the mask and one or more of the keyholes are blocked off by the mask. Other open keyholes are now filled with gate stack material 1602. These filled keyholes will serve as interconnects of the device.

Contacts 1802 can then be patterned into the remaining dielectric gap fill material 1302 that either connect with the source and drain regions (i.e., portions of the fins extending out from under the gates) or with the gate stack material 1602 entrained in the keyholes (i.e., the interconnect structures). See FIG. 18. In the latter case (the case where the contacts connect with the gate stack material in the keyholes), a self-aligned interconnect is formed that is insulated from the adjacent gate material and the underlying source and drain regions. Any via that penetrates the keyhole will be self-aligned to the keyhole region. Contacts can be formed from any suitable metallurgy for making contacts to semiconductor devices including Ti, TiN, Ta, TaN, W, Cu, Al, Si and combinations including at least one of the foregoing materials, such as TiN/Ti/W and TaN/Ta/Cu, Al, TiSix, TaSix, WSix. The procedures for fabricating the contacts would be well within the capabilities of one of skill in the art and thus are not described further herein.

Figure 19:
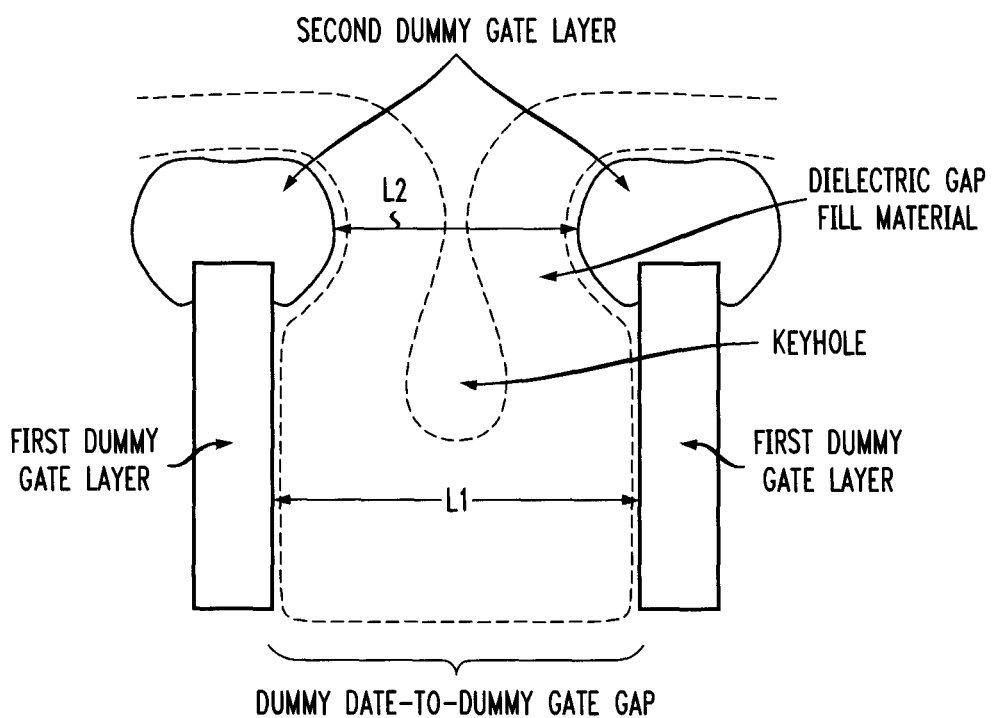
FIG. 19 is a cross-sectional diagram illustrating T-shaped, multilayered dummy gate structures and a dielectric gap fill material having been deposited in the gap between the dummy gate structures using a conformal deposition process forming a keyhole therein according to an embodiment of the present invention.

As described above, when the dielectric gap fill material is deposited between the dummy gates (i.e., into the dummy gate-to-dummy gate gap) using a conformal deposition process, some engineering of the dummy gate-to-dummy gate gap may be needed to make the dummy gate-to-dummy gate gap larger at the top than at the bottom. As described above, this can be achieved using multiple (in this case two) dummy gate layers. As shown in FIG. 19, the first layer of the multi-layer dummy gates (is the same as dummy gates 302/304 and formed in the same manner, i.e., by depositing the dummy gate material and then patterning the dummy gates) is formed having a gate length L1. A second dummy gate layer may then be deposited selectively (e.g., using LPCVD) onto the first dummy gate layer having a gate length L2, wherein L1 is greater than L2. Conformal deposition of the dielectric gap fill material will result in keyhole formation therein. See FIG. 19.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a field effect transistor (FET) device, the method comprising the steps of:
   providing a wafer;
   forming at least one active area in the wafer;
   forming a plurality of dummy gates over the active area, wherein the dummy gates cover portions of the active area that serve as channel regions of the device and wherein portions of the active area that extend out from under the dummy gates serve as source and drain regions of the device;
   filling spaces between the dummy gates with a dielectric gap fill material such that one or more keyholes defined by a gap are formed in the dielectric gap fill material, and wherein the keyholes are present in between the dummy gates and extend parallel to the dummy gates through the dielectric gap fill material;
   removing the dummy gates to reveal a plurality of gate canyons in the dielectric gap fill material;
   forming a mask that i) is perpendicular to the gate canyons and divides at least one of the gate canyons, ii) blocks off one or more of the keyholes by filling at least a portion of one or more of the keyholes; and
   depositing at least one gate stack material onto the wafer filling the gate canyons and the un-blocked keyholes, wherein the gate stack material deposited into the gate canyons serves as replacement gates of the device and the gate stack material deposited into the un-blocked keyholes serves as interconnect structures of the device.

2. The method of claim 1, wherein the wafer comprises a bulk semiconductor wafer.

3. The method of claim 1, wherein the wafer comprises a semiconductor-on-insulator (SOI) wafer having an SOI layer over a buried oxide (BOX).

4. The method of claim 3, wherein the SOI layer comprises silicon, germanium or silicon germanium.

5. The method of claim 1, wherein the step of forming the dummy gates comprises the steps of:
   blanket depositing a dummy gate material onto the wafer, covering the active area; and
   patterning the dummy gate material to form the dummy gates.

6. The method of claim 5, wherein the dummy gate material comprises polysilicon, high temperature compatible carbon or silicon nitride.

7. The method of claim 1, wherein the dielectric gap fill material comprises silicon oxide, silicon nitride, a low-k dielectric or high-stress films.

8. The method of claim 1, wherein the step of filling spaces between the dummy gates with a dielectric gap fill material such that one or more keyholes are formed in the dielectric gap fill material between the dummy gates comprises the step of:
   depositing the dielectric gap fill material using chemical vapor deposition (CVD), plasma-enhanced CVD (PECVD), low pressure CVD (LPCVD), evaporation, sputtering or atomic layer deposition (ALD).

9. The method of claim 1, further comprising the step of:
   removing a portion of the dielectric gap fill material to expose the dummy gates.

10. The method of claim 1, wherein the dummy gates are removed using wet chemical etching or dry etching.

11. The method of claim 1, wherein the mask is formed from a printable dielectric.

12. The method of claim 11, wherein the step of forming the mask comprises the steps of:
depositing the printable dielectric onto the wafer filling the keyholes and the gate canyons;
cross-linking the printable dielectric in areas where the mask is desired; and
removing uncross-linked portions of the printable dielectric using a developer.

13. The method of claim 12, wherein the printable dielectric is deposited onto the wafer using a spin-on process.

14. The method of claim 12, wherein the printable dielectric is cross-linked using 193 nm photolithography, extreme ultraviolet (EUV) or e-beam lithography.

15. The method of claim 12, wherein the printable dielectric comprises hydrogen silsesquioxane (HSQ).

16. The method of claim 1, wherein the mask is formed from a high temperature compatible carbon material.

17. The method of claim 16, wherein the step of forming the mask comprises the steps of:
depositing the high temperature compatible carbon material onto the wafer filling the keyholes and the gate canyons; and
patterning the high temperature compatible carbon material to form the mask.

18. The method of claim 1, further comprising the step of:
removing a portion of the at least one gate stack material to expose the dielectric gap fill material.

19. The method of claim 1, further comprising the step of:
patterning contacts in the dielectric gap fill material.

20. The method of claim 19, wherein one or more of the contacts connect with the source and drain regions of the device and one or more other of the contacts connect with the interconnect structures of the device.

21. The method of claim 1, wherein the FET device comprises a finFET device, the method further comprising the step of:
patterning a plurality of fins in the wafer.

22. The method of claim 21, wherein the dummy gates cover at least a portion of each of the fins that serve as channel regions of the device and wherein portions of the fins extending out from under the dummy gates serve as source and drain regions of the device.

* * * * *